United States Patent [19]

Morrone et al.

[11] Patent Number: 5,576,622

[45] Date of Patent: *Nov. 19, 1996

[54] SHIELDED NMR RADIO FREQUENCY COIL AND METHOD OF PERFORMING AN NMR EXPERIMENT

[75] Inventors: Terry Morrone, Greenlawn; Jan V. Votruba, Port Jefferson Station, both of N.Y.

[73] Assignee: Fonar Corporation, Melville, N.Y.

[ * ] Notice: The portion of the term of this patent subsequent to Dec. 16, 2012, has been disclaimed.

[21] Appl. No.: 791,338

[22] Filed: Nov. 14, 1991

[51] Int. Cl.⁶ .................................................. G01R 33/28
[52] U.S. Cl. .......................... 324/318; 324/322; 335/301; 128/653.5
[58] Field of Search ...................... 324/322, 318, 324/313, 314, 300, 309, 307; 333/219, 222; 335/299, 301, 214, 304; 336/84 R, 84 M; 128/653.5

[56] References Cited

U.S. PATENT DOCUMENTS

| | | | |
|---|---|---|---|
| 3,671,902 | 6/1972 | Westendorp | 335/301 |
| 4,806,894 | 2/1989 | Koto | 335/304 |
| 4,833,409 | 5/1989 | Eash | 324/322 |
| 4,839,595 | 6/1989 | Boskamp | 324/318 |
| 4,851,780 | 7/1989 | Dejon et al. | 324/322 |
| 4,857,850 | 8/1989 | Mametsa et al. | 324/318 |
| 4,871,969 | 10/1989 | Roemer | 324/318 |
| 4,879,515 | 11/1989 | Roemer | 324/318 |
| 4,924,184 | 5/1990 | Yoda | 324/318 |
| 5,006,805 | 4/1991 | Ingwersen | 324/318 |
| 5,081,418 | 1/1992 | Hayes | 324/318 |
| 5,128,643 | 7/1992 | Newman | 324/318 |
| 5,132,621 | 7/1992 | Kang et al. | 324/318 |
| 5,278,505 | 1/1994 | Arakawa | 324/322 |

OTHER PUBLICATIONS

W. A. Edelstein et al., "The Intrinsic Signal–to–Noise Raion in NMR Imaging", Magnetic Resonance in Medicine, 3:604–618 (1986).

T. A. Bottomley et al., "Anatomy and Metabolism of the Normal Human Brain Studied by Magnetic Resonance at 1.5 Tesla", Radiology, 150:441–446 (1984).

L. E. Crooks et al., "Magnetic Resonance Imaging: Effects of Magnetic Field Strength", Radiology, 151:127–133 (1984).

Primary Examiner—Sandra L. O'Shea
Assistant Examiner—Raymond Y. Mah
Attorney, Agent, or Firm—Brooks Haidt Haffner & Delahunty

[57] ABSTRACT

An RF coil for NMR experiments having a conductive path for flowing a field-cancelling current to isolate magnetically the RF coil from its environment. NMR data, particularly MRI data from a human subject, is collected with the receiver coil magnetically shielded to avoid loss of the received signal energy to the environment.

19 Claims, 3 Drawing Sheets

SHIELDED NMR RADIO FREQUENCY COIL AND METHOD OF PERFORMING AN NMR EXPERIMENT

BACKGROUND OF THE INVENTION

The present invention relates to nuclear magnetic resonance experiments and more particularly to an NMR radio frequency coil that is magnetically shielded from the NMR system in which it is used.

An apparatus for making measurements using nuclear magnetic resonance phenomena typically includes a magnet for developing a magnetic field in which an object or specimen is placed, some means for exciting nuclear magnetic resonance within the specimen to emit NMR signals, and a receiver coil disposed proximate the specimen within the magnetic field of the magnet for receiving the NMR signals emitted by the specimen. In medical magnetic resonance imaging systems this basic structure can be very elaborate. The magnet, which develops field strengths on the order 0.1 to more than 1.0 tesla, and its associated structure is massive. Several coils of different size and geometry are provided for developing gradient magnetic fields, and excitation magnetic fields, as well as for receiving magnetic resonance imaging (MRI) signals.

A considerable engineering effort has been directed to improving the signal-to-noise ratio (SNR) of MRI signals so as to improve the quality of images derived from the MRI signals. The standard analysis of the problem has identified two sources of noise which degrade the signal-to-noise ratio (SNR). The first noise source is the receiver coil itself. The receiver coil, with a finite resistance, generates electrical noise which is thermal in origin. Secondly, the magnetic component of the RF excitation signal used to excite nuclear magnetic resonance also causes eddy currents within the object being imaged or scanned. This is true even of the human body.

Noise generated by the object is usually a parameter which cannot be changed. Consequently, it has been concluded that for a given set of measurement conditions, i.e., magnetic field strength, pulse sequence and imaging time, the maximum SNR is obtained by improving the receiver coil sensitivity and decreasing the noise which it generates. The analysis leading to this conclusion is developed fully in the article by W. A. Edelstein, et. al., The Intrinsic Signal-to-Noise Ratio in NMR Imaging, *Magnetic Resonance in Medicine* 3, 604–618 (1986). Earlier studies reached the same conclusion. T. A. Bottomley, *Radiology* 1984; 150:441–446, and L. E. Crooks, et. al., *Radiology* 1984; 151:127–133.

SUMMARY OF THE INVENTION

As used in this specification, the term "radio frequency coil" has the usual meaning given it in the NMR field and is not limited to wire loops but includes NMR antenna structure such as surface coils, bird cage antennas and other antenna structure used for transmitting an excitation signal or receiving an NMR signal.

According to the invention, a radio frequency coil for receiving NMR signals is shielded to prevent energy loss by magnetic coupling between the coil and its environment. NMR signals received by the receiver coil are not dissipated by inductive coupling between the receiver coil and the NMR scanner. Consequently, the signal-to-noise ratio is improved by increasing the signal strength of the NMR signal available at the coil output port, relative to an unshielded coil. The RF coil according to the invention can be used as a receiver, transmitter or transceiver coil in an NMR experiment.

A preferred embodiment of the radio frequency coil comprises an inner winding having a spatial distribution for optimizing the sensitivity of the inner winding to NMR signals emitted by a specimen or subject being studied by NMR, and an outer winding adjacent to the inner winding and connected in series with it. The outer winding has a spatial distribution relative to the inner winding for at least partially canceling the magnetic field, developed by currents flowing through the RF coil, in regions of space external to the outer winding. When the RF coil is a receiver coil, the currents are induced by NMR signals received by the receiver coil.

The claimed invention further comprises an NMR apparatus having a magnet for developing a magnetic field, means for exciting a specimen disposed within the magnetic field to emit NMR signals, and a receiver coil disposed proximate the specimen within the magnetic field to receive NMR signals emitted by the specimen. The improvement according to the invention comprises means for reducing magnetic coupling between the receiver coil and the NMR apparatus. In a preferred embodiment the receiver coil comprises the means for reducing magnetic coupling.

The NMR apparatus according to the invention, in one preferred embodiment, includes a ferromagnetic pole piece, and layer of eddy current-suppressing material on tile pole piece, together with a RF coil according to the invention. The RF coil may be a receiver, transmitter or transceiver coil.

In the method according to the invention a subject to be studied by NMR techniques is excited to emit an NMR signal. The emitted NMR signal is received by a receiver coil which is magnetically isolated from its environment for preventing energy loss from the receiver coil to its environments.

DETAILED DESCRIPTION OF THE PREFERRED EMBODIMENTS

Figure 1:
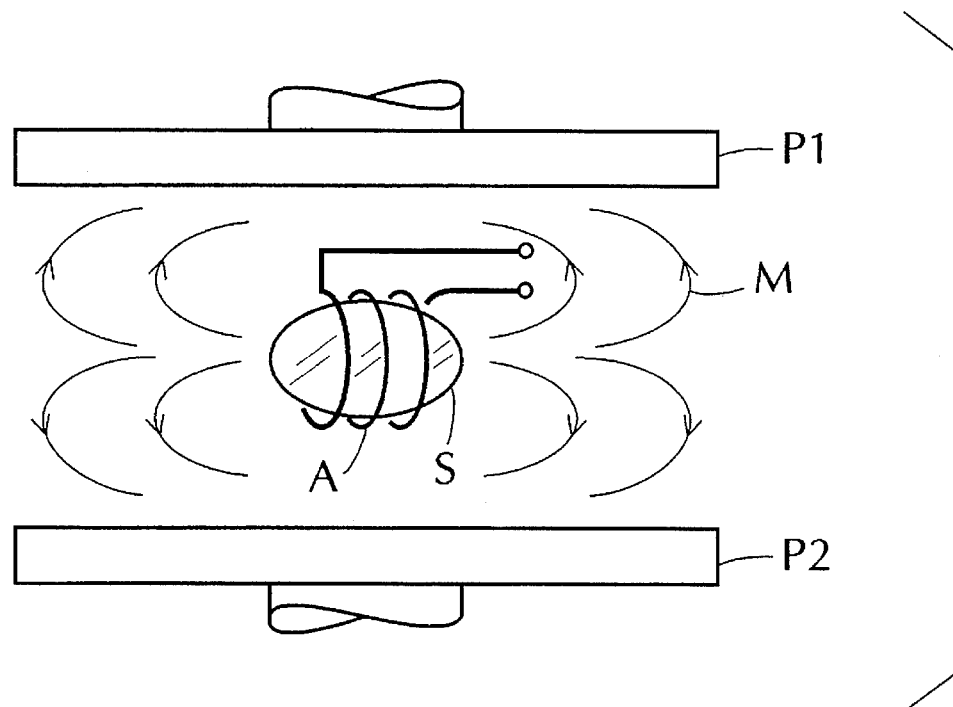
FIG. 1 is a schematic illustration of a conventional radio frequency receiver coil magnetically coupled with the structure of a magnetic resonance imaging apparatus.

In order to appreciate the mode of operation of the invention, its description will be preceded by an explanation of the physical mechanisms behind signal loss and noise generation which occur in connection with the reception of an NMR signal in an NMR scanner. FIG. 1 illustrates a pair of magnet poles P1, P2 having a receiver coil A between them and in the magnetic field of the poles. A sample S is disposed within the receiver coil A. Nuclear magnetic resonance data is obtained by exciting the sample S to emit NMR signals, for example by irradiating it with radio frequency pulses. The NMR signals emitted by the sample S induce an electromotive force within the receiver coil A, and this EMF can be detected for further processing.

Heretofore, the signal-to-noise ratio of the receiver coil output signal has been improved by two mechanisms. First, the coil has been designed and constructed so as to minimize intrinsic coil losses and coil noise. Secondly, the coil sensitivity has been made as high as possible.

Current flowing through the receiver coil A in response to the induced EMF generates a magnetic field M which is represented by flux lines in the drawing. Up until now, it has not been recognized that this magnetic field is an important source of signal loss and consequently it is a cause of degradation in signal-to-noise ratio. The present invention at least substantially reduces magnetic coupling between the receiver coil and its environment, principally the NMR scanner magnet structure, and thus it improves the SNR of the received signal in the receiver coil.

Figure 2:
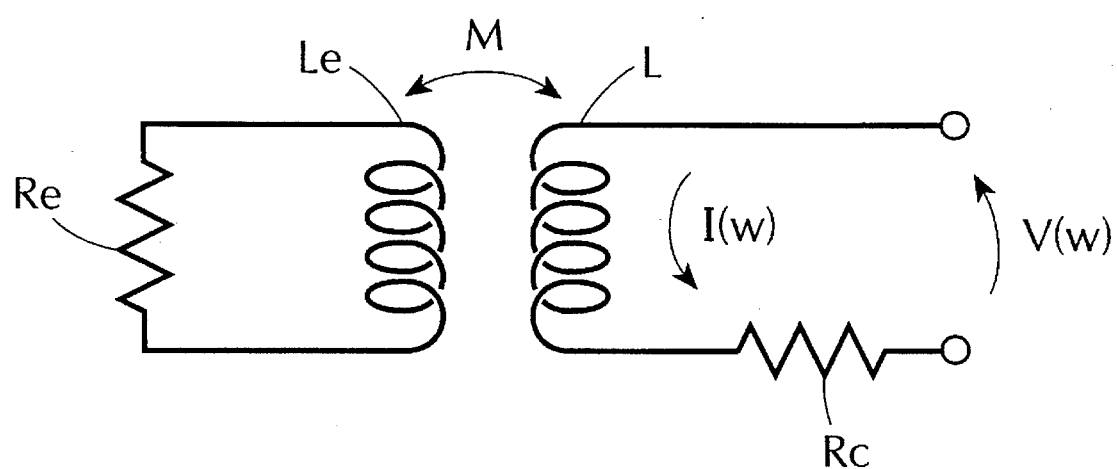
FIG. 2 is a circuit diagram of a circuit model of the loss mechanism resulting from magnetic coupling of a nuclear magnetic resonance receiver coil with its environment.

The loss mechanism associated with inductive coupling of the receiver coil to its environment can be represented by the circuit model illustrated in FIG. 2. The receiver coil unloaded by a specimen is characterized by an inductance value L and a coil resistance Rc. The quality factor or Q value of the coil is given by $$Q = \omega L / Rc \qquad \text{(eqn. 1)}$$

where $\omega$ is the angular frequency of the current in the coil.

Now consider a single eddy current loop induced in the coil environment, such as one of the magnet poles P, by the magnetic flux from the coil. The eddy current conductive path has its own inductance Le and resistance Re. The magnetic coupling is represented by a mutual inductance M, and a voltage $V(\omega)$ of angular frequency $\omega$ is the voltage which if applied would cause the coil current $I(\omega)$ to flow. These parameters are illustrated in the circuit model shown in the drawing.

The ratio $V(\omega)/I(\omega) = Z(\omega)$, the so-called reflected impedance, is given by $$Z = R\lambda + j\omega L\lambda \text{ where} \qquad \text{(eqn. 2)}$$

$$R\lambda = Rc + (\omega^2 M^2 Re)(Re^2 + \omega^2 Le^2)^{-1} \text{ and} \qquad \text{(eqn. 3)}$$

$$L\lambda = L - (\omega^2 M^2 Le)(Re^2 + \omega^2 Le^2)^{-1} \qquad \text{(eqn. 4)}$$

The quantity $R\lambda$ is the resistance of the reflected impedance, and the quantity $L\lambda$ is the inductance of the reflected impedance, when the receiver coil is loaded by the environment of the coil. In the following discussion the terms "loaded Q" and "unloaded Q" refer to the value of the coil Q relative to whether the coil is loaded by its environment. They do not refer to loading of the coil by a specimen. With the above quantities one can define the parameter $Q\lambda$, which is the loaded Q, as $$Q\lambda = \omega L\lambda / R\lambda \qquad \text{(eqn. 5)}$$

$Q\lambda$ is less than $Q = \omega L/Rc$ because $L\lambda < L$ and $R\lambda > Rc$. The ratio of loaded and unloaded Q values, $\eta = Q\lambda/Q$ is a measure of how much energy is lost to the receiver coil's environment. Because of the reciprocal nature of the receiver coil, the value of $\eta$ is also a measure of how susceptible the receiver coil is to currents such as eddy currents flowing in its environment.

In the above discussion the loss of Q value ratio $\eta$ is a result of loading the receiver coil by the environment, and thus it is an indication of susceptibility to environmental losses. It would be desirable to provide means for preventing the magnetic coupling between the receiver coil and its environment to reduce the loss of Q value which results from environmental loading. An examination of eqns. 3 and 4, above, reveals that this is equivalent to reducing the mutual inductance term of the expressions for the components of the reflected impedance.

According to the invention the receiver coil is at least partially decoupled magnetically from its environment. In the preferred embodiment this is done by developing a spatial distribution of current which generates a canceling magnetic field to substantially cancel the magnetic field resulting from the received NMR signal in regions of space outside of the receiver coil. This is done with means for reducing magnetic coupling of the receiver coil which may constitute the receiver coil itself.

Figure 3A:
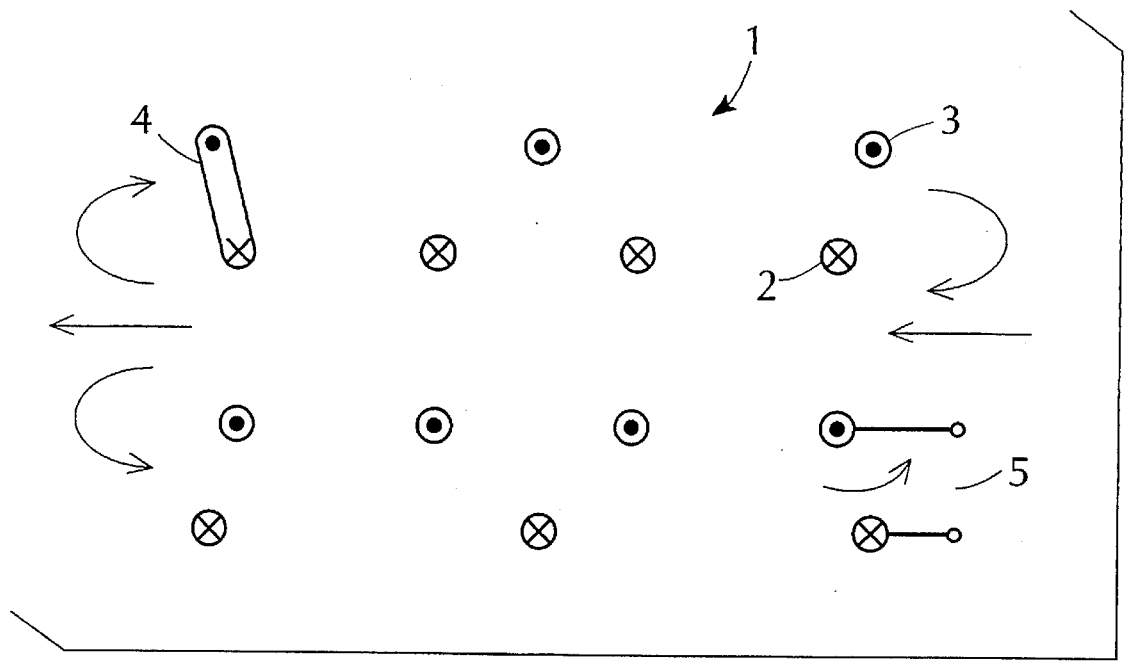
FIG. 3A is a longitudinal section of a radio frequency coil according to the invention.
Figure 3B:
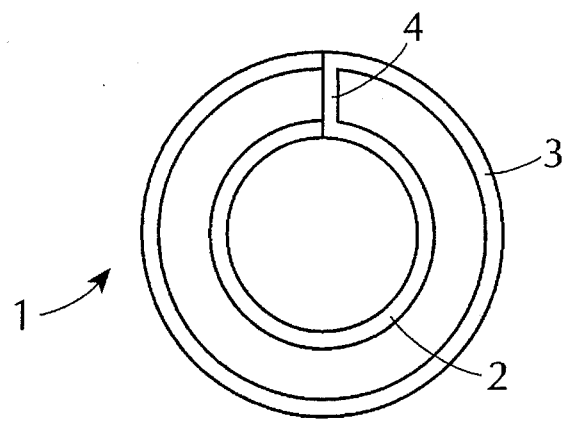
FIG. 3B is an end view of the radio frequency coil shown in FIG. 3A.

FIGS. 3A and 3B show a receiver coil 1 according to the invention which is comprised of an inner winding 2 and an outer winding 3. Both the inner winding 2 and the outer winding 3 are comprised of circular loops. The inner winding 2 and the outer winding 3 are connected at a node 4, so that current flowing through the two windings are in series and opposed. The inner and outer windings each terminate and the two points of termination define an output port 5 of the receiver coil.

The operation of the receiver coil can be understood from FIG. 3A which illustrates a longitudinal section of the coil. In the drawing a current flowing through the coil is depicted by dots and crosses with the dot representing current flow out of the plane of the drawing and a cross indicating current flow into the plane of the drawing. The resulting magnetic flux is represented by arrows. Because the inner winding 2 and the outer winding 3 have current flowing in opposite directions, adjacent layers of the inner and outer windings develop magnetic fields in opposite directions.

The respective magnetic fields resulting from the inner and outer windings substantially cancel in regions of space external to the receiver coil 1. Consequently, an EMF produced in the coil by NMR signals and the resulting current flowing through the coil are not dissipated by magnetic coupling to the NMR scanner magnet or any other external structure.

The following steps constitute a preferred analytical method for designing an RF coil according to the invention.

1. Establish a desired current distribution $J(z)$ for the coil inner winding, expressed by the formula $$J(z) = \sum_{n=0}^{N} An \cos(n\pi z/L) \qquad \text{(eqn. 6)}$$

where z is the coordinate along the axis of the coil, L is the length of the coil, and n, N are integers.

2. Determine the coefficients, An, by the following procedure.

a) For a given outer radius, find the magnetic field produced by a single term in the current distribution sum (eqn. 6) in the region inside the coil, assuming that the outer layer of turns has a current distribution such that no magnetic flux penetrates the outer winding.

b) Decompose the magnetic field derived above (which is in the z-direction) into spherical harmonics as follows:

$$Bz = \sum_{m=0}^{\infty} Cm\, Pm(\cos\theta)\, r^m \qquad (\text{eqn. 7})$$

where r is the radius vector, θ is the polar angle and Pm is m-th Legendre polynomial.

3. Relate the coefficients Cm mathematically to the coefficients An by expanding the field resulting from each term in the current density (eqn. 6) in spherical harmonics to obtain the coefficients Cm.

4. Choose the values of the coefficients Cm to maximize the field inside the coil and minimize it away from the coil, and calculate the values of An from the chosen Cm values.

5. Determine the positions of a discrete set of loops to approximate the current distribution J(z), based on the value An.

6. Determine a current distribution at the outer layer radius which results in a zero field outside the outer winding, and determine the positions of a set of loops approximating the resulting current distribution. The outer winding geometry is a continuous winding comprised of turns at the loop positions.

The coil design procedure outlined above maximizes the sensitivity of a coil within a given spatial region and minimizes energy loss to the environment of the coil. The effectiveness of the magnetic isolation increases with the number of turns used to approximate the desired current distribution. On the other hand, the coil inductance increases with the number of coil turns and may be too high for the coil to resonate at the desired frequency. The coil resonant frequency is given by $\omega = (L(C+Cs))^{1/2}$, where L is the coil inductance, C is the capacitance of a tuning capacitor placed in parallel with the coil and Cs is the distributed capacitance of the coil. If the value L is too large it will be impossible to resonate the coil no matter what the value of C.

One solution to the resonance problem is to make a coil with fewer turns so that the inductance is low enough to resonate. The consequence will be that the effectiveness of magnetic isolation will be impaired.

A second technique is to design a coil with a number of turns giving good field cancellation. Then, the coil, including the inner and outer windings, is physically divided in two or more parts and the parts are connected in parallel. The parallel connection of the two coils has a lower inductance. The resulting structure will exhibit field cancellation provided all the turns have an equal current. This will occur exactly if the signal source induces an equal current in each part of the coil. It has been found that asymmetry in the specimen does not significantly diminish field cancellation in practice.

Figure 4:
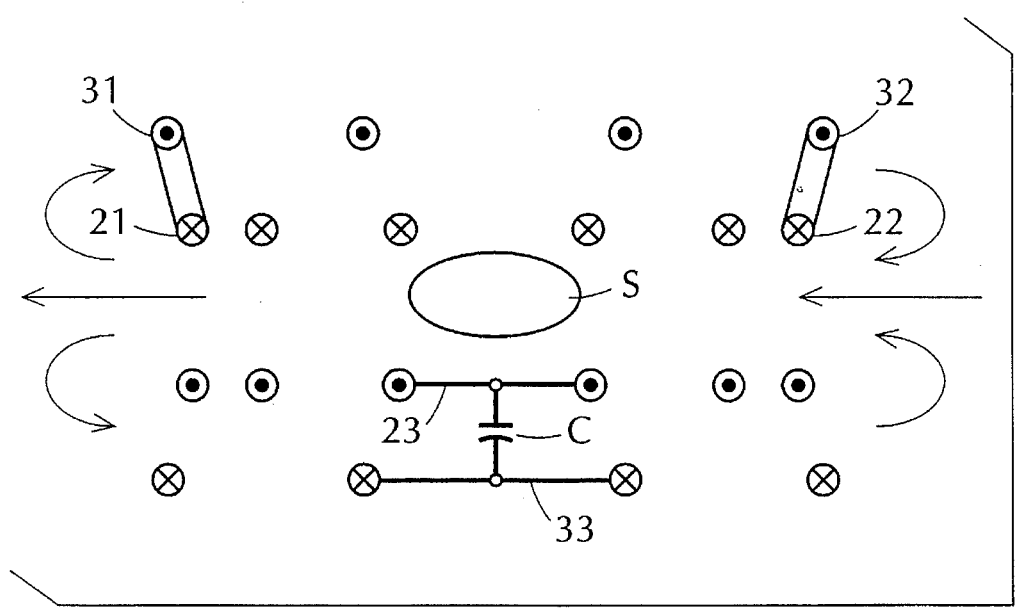
FIG. 4 is a longitudinal section of another embodiment of the radio frequency coil according to the invention.

FIG. 4 illustrates another embodiment of the shielded RF coil according to the invention. The coil is comprised of a pair of inner winding sections 21, 22 that are coaxial and have identical structure. The two inner winding sections 21, 22 are connected together by a conductive link 23. The outer winding is similarly comprised of a pair of outer winding sections 31, 32 which are connected together by a conductive link 33. The two outer winding sections 31, 32 are coaxial and identical.

The inner winding sections 21, 22 are disposed within the outer winding sections, coaxially and symmetrically. Electrically, the inner winding section 21 and outer winding section 31 comprise one shielded RF coil, and the inner winding section 22 and outer winding section 32 comprise a second shielded RF coil. The links 23 and 33 electrically connect the two shielded coils in parallel for reducing their inductance. A tuning capacitor C is connected across the links 23 and 33 to form a parallel resonant circuit with the shielded coils. This structure permits the shielded coils to be made with a sufficient number of turns to obtain a good approximation to a continuous shield structure, and still resonate the circuit at higher frequencies than if a single inductor was used.

More than two shielded coils can be connected in parallel in the manner just described in order to obtain a low inductance value, or to cover a large area without having the RF coil exhibit an impractically high inductance value. One or more tuning capacitors could be used to resonate such a coil.

An example of the embodiment shown in FIG. 4 was constructed for a 12 MHz resonant circuit. The coil was fabricated from ¼ inch diameter copper tubing. The outer diameter of the inner winding sections was nine inches, and the outer diameter of the outer winding sections was eleven inches. Each inner winding section had three full turns spaced respectively one half inch and one inch, and each outer winding section had two full turns spaced one and one half inches. Every turn of the windings was planar, and the turns were connected by straight links extending between the turns in the length direction of the coil.

In order to test the effectiveness of the constructed embodiment of the invention, the coil Q was measured with the coil unloaded by a specimen, with the coil outside of a MRI scanner and inside the MRI scanner. The particular scanner used was equipped with iron magnet poles and ceramic pole faces comprised of a ceramic material which exhibits low eddy current losses but high RF attenuation. The measured Q values are shown in the following:

| Coil Type | COIL Q VALUES | | |
| --- | --- | --- | --- |
| | Outside Magnet | Inside Magnet | η |
| Shielded | 608 | 606 | .997 |
| Standard | 325 | 47 | .145 |

Thus, the shielded coil according to the invention exhibits a very high degree of shielding and excellent Q value maintenance under environmental conditions which seriously degrade the Q of a conventional MRI RF coil.

Figure 5:
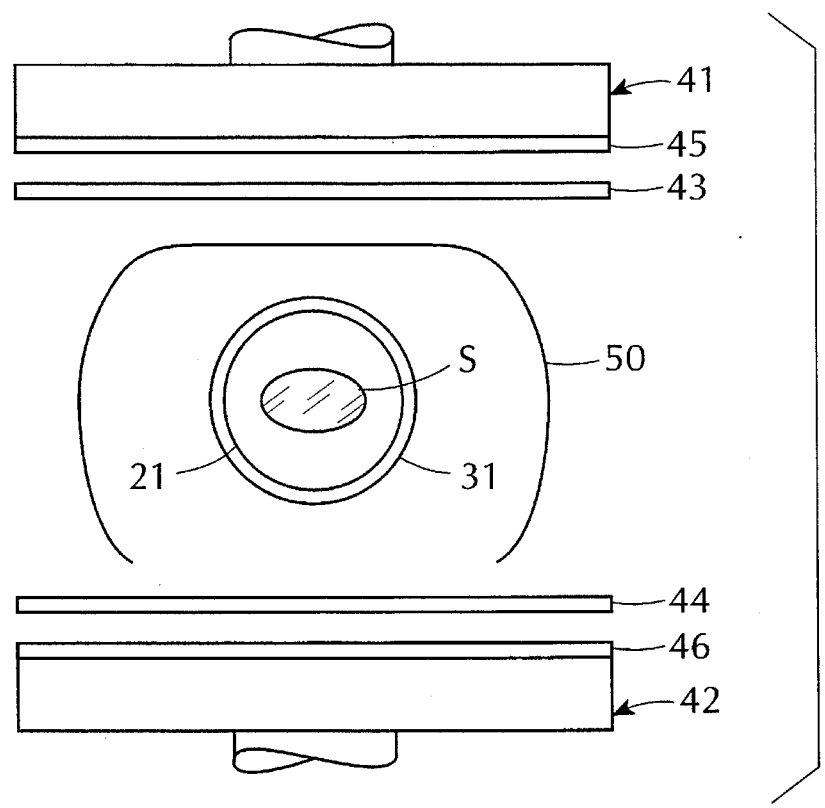
FIG. 5 illustrates a magnetic resonance imaging apparatus which includes a radio frequency receiver coil and a radio frequency transmitter coil according to the invention.

FIG. 5 is a schematic representation of a medical MRI scanner incorporating RF coils according to the invention for both the receiver coil and transmitter coil of the scanner. A pair of magnet poles 41, 42 are disposed facing each other with a gap between them in which a specimen S can be positioned. The specimen S could be a portion of a living human, such as the head, a limb, the thorax, the abdomen or some other part. A system of gradient coils 43, 44 are disposed within the gap of the magnet and are energizable for establishing gradient magnetic field. A transmitter coil 50 is energized in use by RF energy which is radiated and illuminates the specimen S. The RF magnetic field received by the specimen excites the specimen to emit NMR signals.

The receiver coil is comprised of an inner winding 21 and an outer winding 31. The receiver coil with winding 21 and 31 has the structure described above in which the outer winding 31 is effective to magnetically isolate the receiver coil from its environment and in particular to isolate it from magnetic couplings with the magnet poles 41, 42 and the gradient coils 43, 44. The NMR signals emitted from the sample S are received by the receiver coils 21, 31 which comprises the inductor of the resonant circuit which resonates at the frequency of the NMR signals, The current produced in the receiver coil 21, 31 by the NMR signals and the resultant EMF are received, amplified and passed to circuitry for further processing.

In the embodiment of the invention shown in FIG. 5 the magnet poles 41, 42 have disposed on them respective layers 45, 46 of an eddy current-damping material. A suitable material is disclosed in U. S. patent application Ser. No. 498,342, filed on Mar. 23, 1990, now U.S. Pat. No. 5,061, 897 issued Oct. 29, 1991, and commonly assigned herewith. The material exhibits a high resistivity so that any currents induced in the magnet pole faces are attenuated rapidly and do not develop magnetic fields which distort the images derived from the NMR signals. The pole face material, however, also greatly attenuates RF signals. In the case of the transmitted RF signals, the attenuation by the pole face material can at least be partially overcome by increasing the transmitter power. To avoid having to substantially increase the transmitted RF power, the transmitter coil 50 has the structure of the RF coil according to the invention.

The received signal, on the other hand, is limited to the power of the signal emitted by the source S. Any loss of received signal power because of magnetic coupling with pole face material will result in a degradation of signal-to-noise ratio. The shielded receiver coil 21, 31 substantially reduces signal loss because of magnetic coupling with the magnet poles, so that the use of the eddy current-damping layers 44, 46 becomes a practical approach to overcoming gradient pulse distortion because of eddy currents.

The invention has been described herein with connection with the preferred embodiment including an example of an actual embodiment that operated successfully as a receiver coil. The invention is not limited to the specific embodiment discussed, however, and in particular it is not limited to receiver coils. Shielded transmitter coils and duplex or transceiver mode coils are also expressly within the scope of the invention. Moreover, the schematic scanner structure is exemplary only, and those skilled in the art will appreciate that shielded RF coils according to the invention can be used in permanent magnet scanners and electromagnet scanners of both the non-superconducting and superconducting type. Accordingly, the disclosed embodiment should not be taken as limiting, and the scope of the invention is defined solely by the following claims.

We claim:

1. A radio frequency coil for use in NMR measurements, comprising:
    a first, inner coil section for being positioned proximate a specimen from which NMR signals are emitted and having induced therein currents in response to received NMR signals; and
    a second, outer coil section connected in series with said first coil section and through which flows the currents induced by the NMR signals received from the specimen, said second coil section being positioned relative to said first coil section for at least partially canceling the magnetic field developed by said radio frequency coil in regions of space external to said radio frequency coil.

2. A radio frequency coil according to claim 1, wherein said first coil section and said second coil section are solenoids, said second coil section having a diameter greater than the diameter of said first coil section, and said first coil section positioned coaxially within said second coil section, and respective diameters and number of turns of said first and second coil sections selected so that the respective magnetic fields from said first and second coil sections cancel in regions outside said second coil section.

3. A radio frequency coil according to claim 1, further comprising a capacitor connected in parallel with said first and second coil sections for forming a resonant circuit.

4. A radio frequency coil according to claim 1, further comprising third and fourth solenoidal coil sections connected in series, said fourth coil section having a diameter greater than the diameter of said third coil section, and said third coil section positioned coaxially within said fourth coil section, the respective diameters and numbers of turns of said third and fourth coil sections selected so that the respective magnetic fields from said third and fourth coil sections cancel in regions outside said fourth coil section, and the series combination of said first and second coil sections connected in parallel with the series combination of said third and fourth coil sections to reduce the total inductance of the combination of said coil sections.

5. A radio frequency coil according to claim 4, further comprising a capacitor connected in parallel with the parallel combination of said first and second coil sections and said third and fourth coil sections.

6. A radio frequency coil, for receiving NMR signals to be used in magnetic resonance imaging, comprising:
    an inner winding having a spatial distribution for optimizing the sensitivity of said inner winding to NMR signals emitted by a specimen at a particular frequency; and
    an outer winding adjacent said inner winding and connected in series therewith, said outer winding having a spatial distribution relative to said inner winding for at least partially canceling magnetic fields developed by NMR signals flowing through the receiving coil in regions of space external to said outer winding.

7. A radio frequency coil according to claim 6,
    wherein said inner winding is comprised of a conductor wound in a cylindrical helical path and having a pitch and turn spacing effective to optimize the sensitivity of the receiving coil to NMR signals emitted within a predetermined region of space relative to the inner winding; and
    said outer winding comprising a conductor wound in a cylindrical helical path coaxially with said inner winding and connected in series with said inner winding so that a current induced in the inner winding by received NMR signals also flows through said outer winding, and said outer winding having a diameter, pitch and turn spacing effective to at least partially cancel magnetic fields developed by NMR signals received by the receiver coil in regions of space external to said outer winding.

8. A radio frequency coil according to claim 6,
    further comprising a second inner winding and outer winding pair identical to the first-mentioned inner winding and outer winding, and said pair of inner and outer windings disposed coaxially and adjacent to said first-mentioned inner winding and outer winding and connected electrically in parallel for decreasing the inductance of the receiver coil.

9. A radio frequency coil according to claim 6, further comprising:
    a capacitor connected in parallel with said inner and outer windings, forming a resonant circuit resonant at said particular frequency of said NMR signals.

10. A radio frequency coil according to claim 6, further comprising:
    a capacitor connected in parallel with said inner and outer windings, for forming a resonant circuit resonant at a different frequency than said particular frequency of said NMR signals.

11. An NMR apparatus comprising a magnet for developing a magnetic field, means for exciting a specimen disposed within the magnetic field of the magnet to emit NMR signals, and a receiver coil disposed proximate the specimen within the magnetic field of the magnet to receive NMR signals emitted by the specimen, the NMR apparatus further comprising:

means for reducing magnetic coupling between said receiver coil and other parts of the NMR apparatus by forming said receiver coil into an inner winding and an outer winding connected in series, and forming a conductive circuit path therethrough for carrying a current for at least partially cancelling the magnetic field developed by said receiver coil in regions of space external to said receiver coil.

12. The NMR apparatus according claim 11, said means for reducing magnetic coupling is comprised of a section of shielding coil at least partially surrounding said receiving coil for carrying a current in use to develop a magnetic field for canceling the magnetic field developed by said receiving coil in regions of space external to said receiving coil.

13. A method of performing an NMR procedure, comprising:

providing a subject for study by NMR;

irradiating the subject with radio frequency energy to evoke the emission of NMR signals from the subject;

receiving the emitted NMR signals through a receiver coil positioned proximate the anatomical region of interest of the subject, said receiver coil comprising an inner winding and an outer winding connected in series; and cancelling at least part of the magnetic field developed by the receiver coil in regions of space external to said receiver coil.

14. A method according to claim 13, wherein the step of cancelling the magnetic field developed by the receiver coil includes forming a conductive circuit path around the receiver coil, and flowing a current through the conductive circuit path for at least partially cancelling the magnetic field generated in the space exterior to the receiver coil in response to the NMR signal received by the receiver coil.

15. A method according to claim 13, wherein said inner winding and said outer winding in series with the inner winding has a current flowing through both the inner winding and the outer winding, the outer winding constituting a conductive circuit path and having a diameter and configuration to at least partially cancel the magnetic field external to the outer winding generated by said current flowing through the coil, the step of flowing a current comprising the step of receiving the emitted NMR signal with the receiver coil.

16. A method of collecting magnetic resonance imaging data from a human, comprising:

providing a human subject for which magnetic resonance imaging data is to be obtained:

positioning an RF receiver coil for receiving magnetic resonance imaging signals emitted from an anatomical region of interest of the human subject, said receiver coil comprising an inner winding and an outer winding connected in series;

exciting the emission of magnetic resonance imaging signals from the anatomical region of interest of the human subject, said RF receiver coil being magnetically shielded from its environment; and receiving the emitted magnetic resonance imaging signals with the RF receiver coil while maintaining the RF receiver coil magnetically shielded.

17. A method according to claim 16, wherein the RF receiver coil comprises means defining a conductive circuit path for flowing a current developed in response to the received NMR signals and having a configuration effective to cancel magnetic fields developed by the current flowing through the receiver coil in regions of space external to the receiver coil.

18. A method according to claim 16, wherein the RF receiver coil is comprised of an inner winding and an outer winding in series with the inner winding and oriented so that the same current flows through the inner and outer windings in opposite directions for at least partially cancelling the resulting magnetic field in regions external to the receiver coil.

19. A method according to claim 16, further comprising deriving an image from the received magnetic resonance imaging signal.

* * * * *

UNITED STATES PATENT AND TRADEMARK OFFICE
CERTIFICATE OF CORRECTION

PATENT NO. : 5,576,622
DATED : November 19, 1996
INVENTOR(S) : Morrone et al

It is certified that error appears in the above-indentified patent and that said Letters Patent is hereby corrected as shown below:

On the title page: Item [54] and Column 1, line 1 and 2,

The title of the invention should read --NMR RADIO FREQUENCY COILS AND METHODS OF THEIR USE--

Column 2, line 28, "tile" should read --the--;
line 37, "ments" ' should read --ment--.

Column 3, line 47, "($^{-1}$" should read --)$^{-1}$--.

Column 6, line 67 "signals," should read --signals.--

Column 8, line 67, before "forming" delete --for--.

Signed and Sealed this

Seventeenth Day of June, 1997

Attest:

BRUCE LEHMAN

Attesting Officer

Commissioner of Patents and Trademarks